(12) United States Patent
Davidson et al.

(10) Patent No.: US 7,057,397 B1
(45) Date of Patent: Jun. 6, 2006

(54) OUTPUT IMPEDANCE MEASUREMENT TECHNIQUES

(75) Inventors: Allan T. Davidson, San Jose, CA (US); Satwant Singh, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/070,926

(22) Filed: Mar. 3, 2005

(51) Int. Cl.
  *G01R 27/02* (2006.01)
(52) U.S. Cl. .................................. 324/606; 324/158.1
(58) Field of Classification Search ................ 324/606, 324/600
  See application file for complete search history.

(56) References Cited

U.S. PATENT DOCUMENTS

| | | | |
|---|---|---|---|
| 5,134,311 A * | 7/1992 | Biber et al. ................. | 327/108 |
| 6,462,557 B1 * | 10/2002 | Milanesi et al. ............ | 324/606 |
| 6,541,996 B1 * | 4/2003 | Rosefield et al. ............ | 326/30 |
| 6,677,744 B1 * | 1/2004 | Long ......................... | 324/158.1 |
| 2002/0105837 A1 * | 8/2002 | Kim et al. .............. | 365/189.09 |
| 2004/0190176 A1 * | 9/2004 | Takeuchi ..................... | 360/66 |
| 2005/0002223 A1 * | 1/2005 | Coteus et al. ................ | 365/154 |
| 2005/0017790 A1 * | 1/2005 | Kim et al. ................... | 327/530 |
| 2005/0071693 A1 * | 3/2005 | Chun et al. .................. | 713/300 |
| 2005/0168285 A1 * | 8/2005 | Chiang ........................ | 330/259 |
| 2005/0184823 A1 * | 8/2005 | Lee et al. ................... | 333/17.3 |
| 2005/0189983 A1 * | 9/2005 | Sivero et al. ................ | 327/536 |

* cited by examiner

*Primary Examiner*—Anjan Deb
*Assistant Examiner*—John Zhu
(74) *Attorney, Agent, or Firm*—MacPherson Kwok Chen & Heid LLP; Greg J. Michelson

(57) ABSTRACT

Systems and methods are disclosed for providing output impedance measurement techniques. For example, in accordance with an embodiment of the present invention, a system includes a controller adapted to measure an output impedance of a first circuit that provides an output signal having a first voltage level. The output signal from the first circuit is compared to a plurality of voltage levels provided by the controller, with the controller determining the output impedance of the first circuit based on the results of the comparison.

20 Claims, 2 Drawing Sheets

OUTPUT IMPEDANCE MEASUREMENT TECHNIQUES

TECHNICAL FIELD

The present invention relates generally to electrical circuits and, more particularly, to techniques for measuring output impedance of a device.

BACKGROUND

As system data rates and clock frequencies continue to increase, signal integrity issues are becoming more of a concern. For example, certain signal integrity issues may be related to the output impedance of the drivers that drive signals from the integrated circuit (i.e., driving signals off-chip).

Consequently, as a specific example, the next generation of high-speed synchronous memory devices (e.g., DDR2 or GDDR3) have output drivers with adjustable output impedances. The output impedance of the output drivers may be adjusted after the device is powered up by loading bit patterns into registers inside the memory device. The apparent intent of this scheme is that a memory controller (e.g., implemented within a programmable logic device, application specific integrated circuit, or other type of circuit, such as a processor) will measure the output impedance of the output drivers on the memory device. The memory controller will then load the registers in the memory device with the appropriate bit patterns to optimize the output impedance of the output drivers. Thus, optimum signal integrity may be achieved and memory read access times may be minimized.

The adjustable output driver output impedance feature may be applied not only to memory devices, but also to other types of integrated circuits that may be required to provide information. However, the problem exists generally as to the appropriate technique for a first device to measure the output impedance of the output drivers on another device that is connected to the first device. For example, for the memory device example above, it may be required that the memory controller must also function to measure the output impedance of the output drivers of the memory device. As a result, there is a need for output impedance measurement techniques.

SUMMARY

In accordance with one embodiment of the present invention, a system includes a controller adapted to measure an output impedance of a first circuit, the first circuit adapted to provide an output signal comprising a first voltage level; and at least one input receiver adapted to receive the output signal from the first circuit and compare to a plurality of voltage levels provided by the controller, wherein the controller determines the output impedance of the first circuit based on the results of the comparison by the at least one input receiver.

In accordance with another embodiment of the present invention, an integrated circuit includes means for controlling the measurement of an output impedance of a first circuit, the first circuit adapted to provide an output signal comprising a first voltage level; means for providing a plurality of voltage levels; and means for receiving the output signal from the first circuit and comparing to the plurality of voltage levels, wherein the controlling means determines the output impedance of the first circuit based on the results of the comparison.

In accordance with another embodiment of the present invention, a method of measuring an output impedance includes commanding a first circuit to provide a first signal; providing a plurality of voltage levels; comparing two or more of the plurality of voltage levels to the first signal to determine a voltage level of the first signal; and determining the output impedance of the first circuit based on the comparing of the first signal.

In accordance with another embodiment of the present invention, a machine-readable medium is disclosed for storing instructions to be executed by a processor for performing a method of measuring an output impedance of a circuit, with the method including commanding a first circuit to provide a first signal; providing a plurality of voltage levels; comparing two or more of the plurality of voltage levels to the first signal to determine a voltage level of the first signal; commanding the first circuit to provide a second signal having a different voltage level than the first signal; comparing two or more of the plurality of voltage levels to the second signal to determine a voltage level of the second signal; and determining the output impedance of the first circuit based on the comparing of the first signal and the comparing of the second signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with one or more embodiments of the present invention, systems and methods are disclosed that are directed to enabling one device (e.g., a programmable logic device, a specialized circuit, or a processor-based device) to measure the output impedance of a connected device. The measurement techniques may be performed, for example in accordance with an embodiment of the present invention, in a reasonably non-obtrusive fashion, such that no additional circuitry or loading is added to the signal being measured. For example, with high-speed systems, additional loading is generally not acceptable because of the potential impact on signal integrity.

Figure 1:
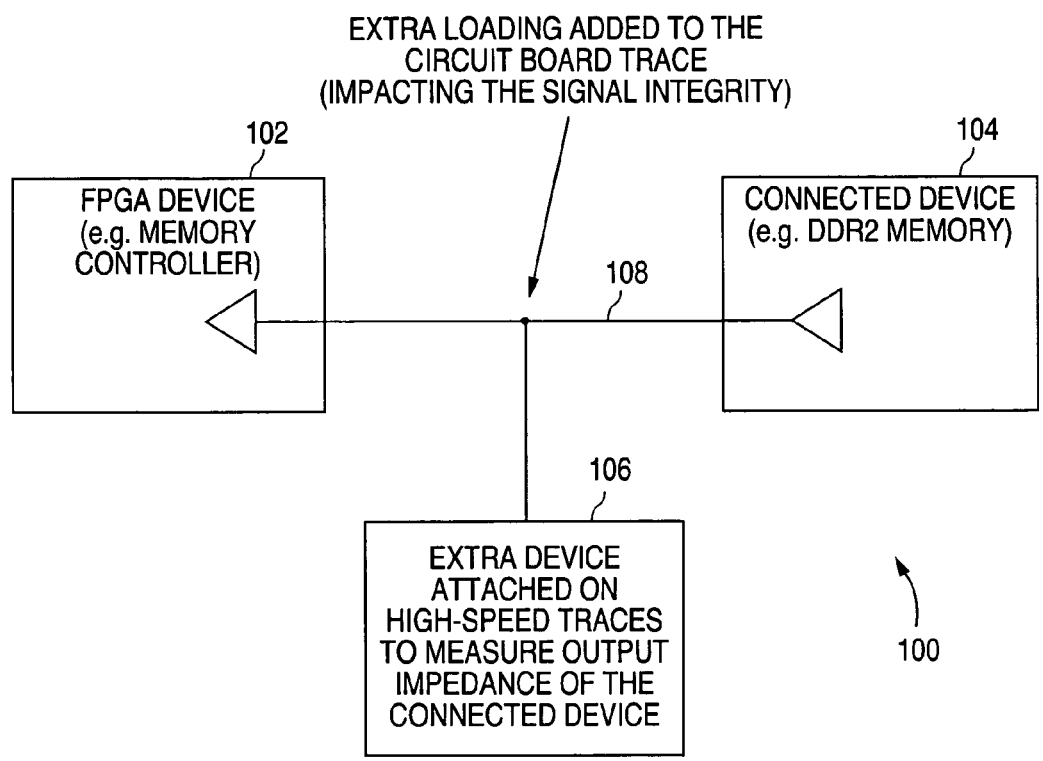
FIG. 1 shows a block diagram illustrating a technique for measuring output impedance of a device in accordance with an embodiment of the present invention.

Thus, various approaches are possible for performing the output impedance measurement, with some approaches adding additional circuitry (and loading) to the signal being measured. For example, one exemplary approach for performing the output impedance measurement is illustrated in FIG. 1, which shows a block diagram of a circuit 100 for measuring output impedance of a device in accordance with an embodiment of the present invention. Circuit 100 includes a first device 102, a second device 104, and a third device 106.

First device 102 may represent any type of circuit implementation (e.g., a processor, an application specific integrated circuit, or a programmable logic device, such as a field programmable gate array (FPGA)) that can provide memory controller functionality. Second device 104 may represent any type of circuit implementation (e.g., a memory device) that provides information (or any type of signal) and whose output impedance is to be measured. Third device 106 may represent any type of circuit implementation coupled to a signal path 108 between first device 102 and second device 104, with third device 106 provided to measure the output impedance of second device 104.

Third device 106 is an additional component (e.g., on the circuit board) that is connected to signal path 108 (e.g., high-speed traces) to measure the output impedance of second device 104. As an example, third device 106 may include an analog-to-digital converter (ADC) that directly measures output high and output low voltage levels provided by output drivers of second device 104. The output impedance of the output drivers, as discussed further herein, may then be determined. However, to measure several signals (e.g., on corresponding signal paths 108), several ADCs would be required or a multiplexing of the signals to the ADC would be necessary.

After the output impedance measurement is completed, third device 106 would continue to load signal path 108 and, thus, affect the signal integrity. Consequently, circuit 100 may not operate properly for higher data rates (e.g., above a few hundred megabits per second, such as with 400 Mbps DDR memory) due to its intrusive nature.

Figure 2:
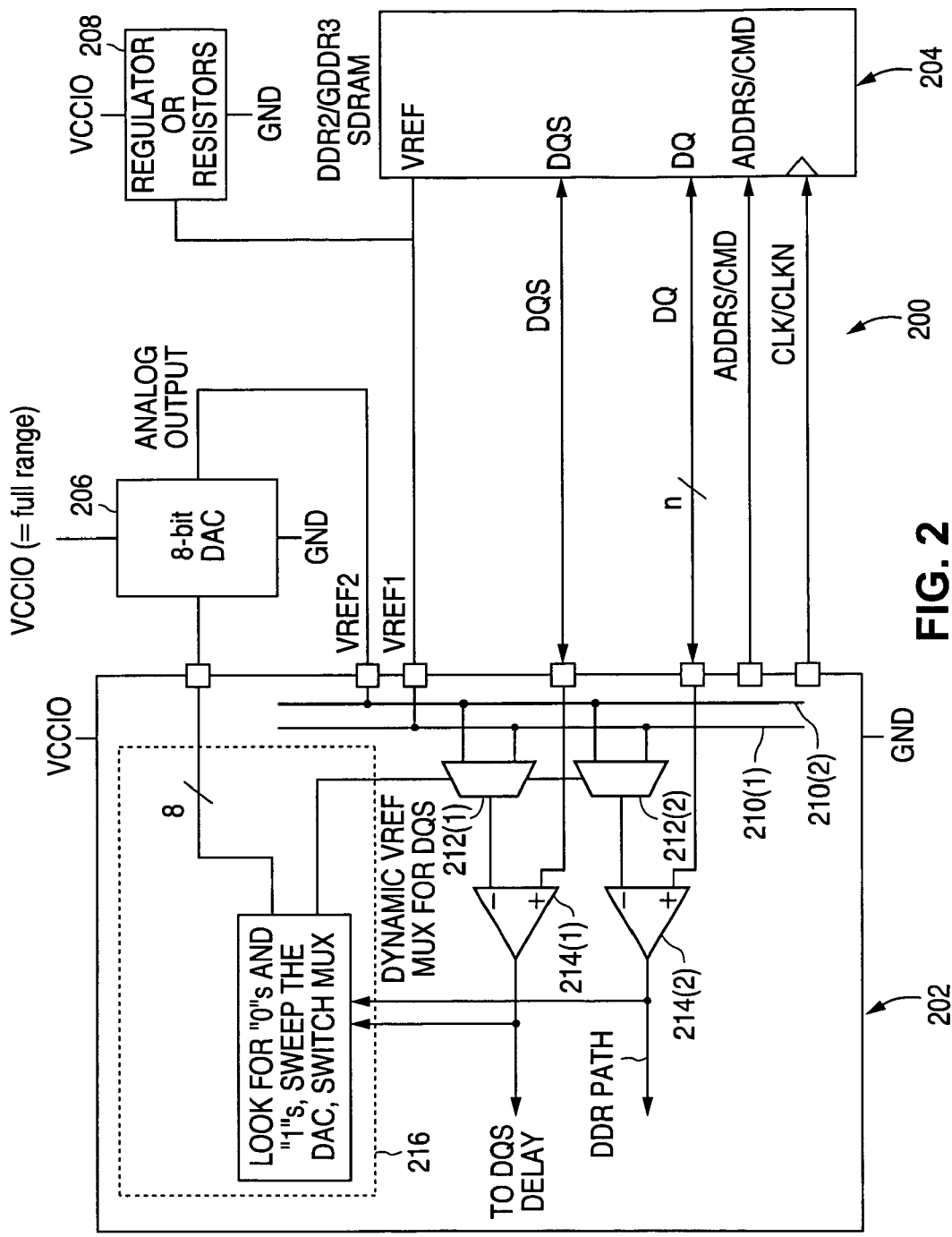
FIG. 2 shows a block diagram illustrating a technique for measuring output impedance of a device in accordance with an embodiment of the present invention.

As another example, one exemplary non-intrusive approach for performing the output impedance measurement is illustrated in FIG. 2, which shows a block diagram illustrating a circuit 200 for measuring output impedance of a device in accordance with an embodiment of the present invention. Circuit 200 includes a circuit 202, a memory 204, a digital-to-analog converter (DAC) 206, and a voltage regulator 208.

Circuit 202, for example, may be any type of integrated circuit, which can provide memory controller functionality as described herein. For example, circuit 202 may represent a programmable logic device (e.g., a field programmable gate array or a complex programmable logic device), an application specific integrated circuit, or a processor-based device. Furthermore, it should be understood that the techniques or operations disclosed herein may be implemented within software that is executed by a processor. The software may be stored on a machine-readable medium, such as a hard drive, a compact disk, or other types of memory.

In this exemplary implementation, memory 204 represents a memory device, but the techniques discussed herein are not limited to memory devices. For example, memory 204 may represent any type of circuit whose output impedance is to be measured. Furthermore, DAC 206 may be substituted with another type of device that provides variable voltage levels. DAC 206 may be formed as part of voltage regulator 208 to provide a number of regulated voltage levels. Voltage regulator 208 may represent any type of circuit (e.g., a conventional voltage regulator or a number of resistors) that is configurable to provide one or more voltage levels.

It should be understood that circuit 200 represents an exemplary implementation and the techniques discussed herein may be implemented in any number of ways. For example, circuit 202 may include DAC 206 and/or voltage regulator 208 and may even further include memory 204. Certain advantages may be obtained by combining one or more elements, such as for example if circuit 202 includes DAC 206, then one or more input terminals would not be required to receive the different reference voltages provided by DAC 206.

Circuit 202 includes buses 210, multiplexers 212, input receivers 214, and a controller 216 (e.g., a memory controller). Multiplexers 212 may be controlled (e.g., independently) by controller 216 to select from reference voltages on buses 210 to provide to input receivers 214. Thus, multiplexers 212 may be dynamically switched by controller 216 to select the desired reference voltage on one of buses 210 provided by DAC 206, which is also controlled by controller 216. Controller 216, for example, may represent an off-chip driver calibration algorithm (Intellectual Property (IP) block) that may be implemented in circuit 202 (e.g., a field programmable gate array) or controller 216 may represent a specialized circuit or a software program executed by a processor.

As explained further herein, controller 216, for example, may command one or more of multiplexers 212 to select one reference voltage on one of buses 210 for a period of time and then to select another reference voltage or switch back to a previously selected reference voltage. Furthermore, as disclosed herein, if multiplexers 212 are controlled independently by controller 216, then controller 216 may control one or more of multiplexers 212 to perform an output impedance measurement as described herein, while leaving the remaining multiplexers 212 to continue to select the standard reference voltage. For example, each one of multiplexers 212 may be coupled to a corresponding input terminal and/or associated with one of input receivers 214 and dynamically and independently controlled (i.e., multiplexer 212(1) associated with input receiver 214(1)). Thus, the rest of the system or circuitry of circuit 202 may operate normally, while a portion of the system is utilized to measure the output impedance of the connected device (e.g., memory 204).

In general for this exemplary implementation, in accordance with an embodiment of the present invention, memory 204 (e.g., DDR2, GDDR3, or SDRAM memory) is coupled to controller 216 so that information can be exchanged between memory 204 and controller 216. DQS (strobe) and DQ (data) signals between memory 204 and circuit 202 are bidirectional, with output impedances of high-speed DQS and DQ drivers (not shown) on memory 204 adjustable as would be known by one skilled in the art.

Circuit 202 with controller 216 performs a technique, in accordance with an embodiment of the present invention, to measure the output impedance of the DQS and DQ drivers of memory 204. Circuit 202 may also adjust the output impedance of the DQS and DQ drivers of memory 204 by sending a command (e.g., a bit pattern) to memory 204. The signaling scheme may be SSTL25 or SSTL 18 or any other type of signaling scheme desired for the intended application and type of device.

During normal operation of circuit 200, multiplexers 212 select a reference voltage (VREF1), provided by voltage regulator 208, for input receivers 214. The reference voltage (VREF1) may also be provided to memory 204. The number of buses 210, multiplexers 212, and input receivers 214 are not limited and may be any number desired for the intended application.

To measure the output impedance of the DQS and DQ drivers of memory 204, memory 204 is first commanded by controller 216 to drive a logic "1" signal (i.e., a logical high level) on the DQS and DQ signal paths (e.g., as known in the art certain devices, including some types of memory, can be commanded to provide a logic "1" and/or "0" signal level). Controller 216 also commands multiplexers 212(1) and 212(2), which are associated with input receivers 214(1) and 214(2) corresponding to the DQS and DQ signal paths, to select bus 210(2) that carries a reference voltage (VREF2) provided by DAC 206 to be the reference voltage for input receivers 214. During this period, for example, other portions of circuit 202 and memory 204 may still receive the reference voltage (VREF1) on bus 210(1) from voltage regulator 208.

Controller 216 controls DAC 206 to step the voltage level of the reference voltage (VREF2) sequentially through the voltage range of DAC 206 or through some portion of the voltage range around the expected value of the logic "1" signal level provided by memory 204. DAC 206, for example, may be an 8-bit DAC, with 9.8 mV and 7.0 mV steps for a supply voltage (VCCIO) of 2.5 V or 1.8 V, respectively.

When the voltage level of the reference voltage (VREF2) provided by DAC 206 crosses over the logic "1" signal level from memory 204, input receivers 214 (i.e., input receivers 214(1) and 214(2)) switch their output state. This is then detected by controller 216, which monitors the output states of input receivers 214 and correlates the switch with the present voltage level being provided by DAC 206. Thus, the output high voltage levels of the drivers on the DQS and DQ signal paths of memory 204 can be measured relative to the voltage levels provided by DAC 206, which are known and controlled by controller 216.

Because the resistive loading on each of the DQS and DQ signal paths would be known (e.g., typically this may be a resistor termination on the signal paths), the determined output high voltage level (logic "1" signal level) can be used to measure the output impedance of memory 204 (e.g., the output impedance of the pull-up transistor of the output driver of memory 204). For example for a specific implementation, given a desired output impedance of memory 204 of 25 ohms and resistor terminations providing an expected output current from memory 204 of 8 mA, an expected voltage drop across the output impedance of memory 204 is then 200 mV and an expected logic "1" signal level on the DQS and DQ signal paths is then 200 mV lower than may be anticipated from memory 204. The reference voltage (VREF2) values from DAC 206 may then be compared to the logic "1" signal level from memory 204. The difference in voltage levels from the expected and the measured (relative to the reference voltage (VREF2) value) can be used to adjust the output impedance of memory 204, as explained further herein.

After the test is completed for the logic "1" signal level, memory 204 may then be commanded by controller 216 to drive a logic "0" signal (i.e., a logical low level) on the DQS and DQ signal paths. With multiplexers 212 commanded to select bus 210(2) that carries the reference voltage (VREF2) provided by DAC 206 and which is to be the reference voltage for input receivers 214, controller 216 controls DAC 206 to step the voltage level of the reference voltage (VREF2) sequentially through the voltage range of DAC 206 or through some portion of the voltage range around the expected value of the logic "0" signal level provided by memory 204. During this period, for example, other portions of circuit 202 and memory 204 may still receive the reference voltage (VREF1) from voltage regulator 208.

When the voltage level of the reference voltage (VREF2) provided by DAC 206 crosses over the logic "0" signal level from memory 204, input receivers 214 (i.e., input receivers 214(1) and 214(2)) switch their output state. This is then detected by controller 216, which monitors the output states of input receivers 214 and correlates the switch with the present voltage level being provided by DAC 206. Thus, the output low voltage levels of the drivers on the DQS and DQ signal paths of memory 204 can be measured relative to the voltage levels provided by DAC 206, which are known and controlled by controller 216. Furthermore, as similarly described for the logic "1" signal level test procedure, the determined output low voltage level is then used as a measure of the output impedance of memory 204 (e.g., the output impedance of the pull-down transistor of the output driver of memory 204).

Once the output impedance of memory 204 is determined (e.g., the output impedance of the pull-up and pull-down transistors of the output driver of memory 204), controller 216 can then determine and provide the appropriate information to memory 204 (e.g., bit pattern stored in registers of memory 204) to set and possibly optimize the driver output impedances of memory 204. In general, for a given driver, pull-up transistor parameters may be matched to pull-down transistor parameters, with the output impedance then matched across all of the output drivers.

To resume normal operation, after one or more of the desired test procedures have been completed, controller 216 commands multiplexers 212, which are associated with input receivers 214 being tested, to select one of buses 210 (i.e., bus 210(1) for this example) that provides the reference voltage (VREF1) from voltage regulator 208. At any time during system operation, because multiplexers 212 may be dynamically switched under control of controller 216, the output impedance of memory 204 may be measured or measured again and adjusted if necessary (e.g., retest due to a system request or higher-level logic determining that the memory interface error rate is too high). Minimal system disruption, for example, may occur due to controller 216 switching only those multiplexers 212 necessary to perform the desired output impedance measurements, while leaving the remaining multiplexers 212 and related circuitry operating normally.

Furthermore, in accordance with an embodiment of the present invention, the techniques disclosed herein may also be employed to measure the output impedance of the drivers on circuit 202. For example, the output driver (not shown) may be enabled, while the referenced input receiver on the same pin is used to measure the driver output impedance in the same way as described above in reference to FIG. 2. Thus, the output impedance of the on-chip output drivers may be measured and this information used to adjust the output impedance and optimize the output drivers (e.g., provided the output drivers can be optimized using register bits rather than through reconfiguration if circuit 202 is a programmable logic device).

Systems and methods are disclosed herein to provide output impedance measurement techniques. For example, in accordance with an embodiment of the present invention, a dynamically switched voltage reference multiplexer, under control of a controller (e.g., a memory controller), allows input signals to an input receiver to be dynamically selected between a standard reference voltage (VREF) during normal operation and one or more different reference voltages when measuring the output impedance of a device (e.g., a connected memory device).

The standard reference voltage (VREF) may be provided by a reference regulator on a circuit board (or formed as part of the controller as an integrated circuit). The different reference voltages, which are utilized to measure the output impedance of the device, may be provided, for example, by a digital-to-analog converter (DAC) that is stepped sequentially through its range or some portion of its range.

The dynamic selection of the reference voltages allows the input receiver to operate normally using the standard reference voltage (VREF), while also being capable of utilizing one or more of the different reference voltages to perform driver output impedance measurements. For example, independent control of dynamic multiplexers allows some receivers to remain connected to the standard reference voltage (VREF), while other receivers are switched to one or more of the different reference voltages.

As a specific implementation example, in accordance with an embodiment of the present invention, one or more dynamically switched analog multiplexers may be employed (e.g., within a field programmable gate array) for providing input receiver reference voltages so that the output impedance of one or more attached devices may be measured. Thus, one device may measure the driver output impedance of one or more connected devices and then make adjustments or accommodate the measured driver output impedances. In general, the technique of dynamically switched voltage reference multiplexers is non-intrusive, as compared to conventional techniques, and does not add additional loading to the high-speed signal paths.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system comprising:
    a first integrated circuit having an output impedance and adapted to provide an output signal comprising a first voltage level;
    a second integrated circuit having a controller adapted to measure the output impedance of the first integrated circuit;
    at least one input receiver of the second integrated circuit adapted to receive the output signal from the first integrated circuit and compare the first voltage level of the output signal to a plurality of voltage levels provided by the controller; and
    a signal path providing the output signal from the first integrated circuit to the at least one input receiver, the signal path having a resistive loading,
    wherein the controller determines the output impedance of the first integrated circuit, apart from the resistive loading of the signal path, based on the results of the comparison by the at least one input receiver.

2. The system of claim 1, further comprising:
    a digital-to-analog converter adapted to provide the plurality of voltage levels under the control of the controller; and
    at least one multiplexer, corresponding to the at least one input receiver, adapted to provide under the control of the controller the plurality of voltage levels or a reference voltage to the at least one input receiver.

3. The system of claim 2, further comprising a voltage regulator adapted to provide the reference voltage.

4. The system of claim 2, wherein the controller, the at least one input receiver, and the digital-to-analog converter are formed within the second integrated circuit.

5. The system of claim 1, wherein the controller further commands the first integrated circuit to provide the output signal comprising at least one of the first voltage level and a second voltage level.

6. The system of claim 1, wherein the controller comprises at least one of a programmable logic device, an application specific integrated circuit, and a processor-based integrated circuit.

7. The system of claim 1, wherein the controller provides information to the first integrated circuit to adjust the output impedance of the first integrated circuit based on the results of the comparison.

8. The system of claim 1, wherein the first integrated circuit comprises a memory device, and the second integrated circuit comprises at least one of a programmable logic device, an application specific integrated circuit, and a processor-based device.

9. An integrated circuit comprising:
    means for controlling the measurement of an output impedance of a first integrated circuit, the first integrated circuit adapted to provide an output signal comprising a first voltage level;
    means for providing a plurality of voltage levels; and
    means for receiving the output signal from the first integrated circuit and comparing the first voltage level to the plurality of voltage levels, wherein the controlling means and the receiving means are separated from the first integrated circuit by a signal path providing the output signal from the first integrated circuit, the signal path having a resistive loading, and wherein the controlling means determines the output impedance of the first integrated circuit, apart from the resistive loading of the signal path, based on the results of the comparison.

10. The integrated circuit of claim 9, wherein the means for providing a plurality of voltage levels further comprises means for providing a reference voltage.

11. The integrated circuit of claim 9, further comprising means for selectively providing a reference voltage or the plurality of voltage levels to the receiving means, and wherein the controlling means further comprises means for commanding the first integrated circuit to provide the output signal having the first voltage level and commanding the first integrated circuit to provide the output signal having a second voltage level.

12. The integrated circuit of claim 9, wherein the controlling means further comprises means for commanding the first integrated circuit to adjust the output impedance based on the results of the comparison.

13. The integrated circuit of claim 9, wherein the first integrated circuit comprises a memory device, and the integrated circuit comprises at least one of a programmable logic device, an application specific integrated circuit, and a processor-based device.

14. A method of measuring an output impedance, the method comprising:
    commanding a first integrated circuit to provide through a first output signal path a first signal, the first output signal path having a resistive loading;
    receiving the first signal provided through the first output signal path;
    providing a plurality of voltage levels;
    comparing two or more of the plurality of voltage levels to the first signal to determine a voltage level of the first signal; and determining the output impedance of the first integrated circuit, apart from the resistive loading of the first output signal path, based on the comparing of the first signal.

15. The method of claim 14, further comprising:
commanding the first integrated circuit to provide through the first output signal path a second signal having a different voltage level than the first signal;
receiving the second signal provided through the first output signal path;
comparing two or more of the plurality of voltage levels to the second signal to determine a voltage level of the second signal; and
determining the output impedance of the first integrated circuit, apart from the resistive loading of the first output signal path, based on the comparing of the second signal.

16. The method of claim 15, further comprising adjusting the output impedance by commanding the first integrated circuit based on the determining for the first signal and the second signal.

17. The method of claim 14, wherein the providing the plurality of voltage levels comprises switching from a first bus that carries a reference voltage to a second bus that provides the plurality of voltage levels.

18. The method of claim 17, further comprising switching back to the first bus after the comparing.

19. A machine-readable medium for storing instructions to be executed by a processor for performing a method of measuring an output impedance of a first integrated circuit, the method comprising:

commanding the first integrated circuit to provide through a first output signal path a first signal, the first output signal path having a resistive loading;
receiving the first signal provided through the first output signal path;
providing a plurality of voltage levels;
comparing two or more of the plurality of voltage levels to the first signal to determine a voltage level of the first signal;
commanding the first integrated circuit to provide through the first output signal path a second signal having a different voltage level than the first signal;
receiving the second signal provided through the first output signal path;
comparing two or more of the plurality of voltage levels to the second signal to determine a voltage level of the second signal; and
determining the output impedance of the first integrated circuit, apart from the resistive loading of the first output signal path, based on the comparing of the first signal and the comparing of the second signal.

20. The method of claim 19, further comprising adjusting the output impedance by commanding the first integrated circuit based on the determining for at least one of the first signal and the second signal.

* * * * *